United States Patent [19]

Lee

[11] Patent Number: 4,907,127
[45] Date of Patent: Mar. 6, 1990

[54] PRINTED CIRCUIT BOARD CONSTRUCTION AND METHOD FOR PRODUCING PRINTED CIRCUIT END PRODUCTS

[76] Inventor: John K. C. Lee, 7F. No.75, Shui Yuan Road, Taipei, Taiwan

[21] Appl. No.: 171,118

[22] Filed: Mar. 21, 1988

[51] Int. Cl.⁴ .............................................. H05K 7/02
[52] U.S. Cl. ...................................... 361/397; 29/832; 29/847; 174/266; 361/395; 361/400; 361/410
[58] Field of Search ............... 174/68.5; 361/400, 410, 361/414, 397, 398, 395, 399; 29/847, 832

[56] References Cited

U.S. PATENT DOCUMENTS

| | | | |
|---|---|---|---|
| 2,985,709 | 5/1961 | Mammola | 174/68.5 |
| 3,408,452 | 10/1968 | Ruehlemann | 174/68.5 |
| 3,564,115 | 2/1971 | Gribble et al. | 174/68.5 |
| 3,674,914 | 7/1972 | Burr | 174/68.5 |
| 4,438,560 | 3/1984 | Kisters | 174/68.5 X |

FOREIGN PATENT DOCUMENTS 3627844 2/1988 Fed. Rep. of Germany ..... 174/68.5

Primary Examiner—Gregory D. Thompson
Attorney, Agent, or Firm—Fleit, Jacobson, Cohn, Price, Holman & Stern

[57] ABSTRACT

The invention relates to a printed circuit board having front and rear sides, each side being provided thereon with a mesh-like conductor pattern consisting of two crossing sets of plural metal traces. A through hole passing through the board at every second crossing point of the traces in each direction of the traces on each side of the board.

2 Claims, 4 Drawing Sheets

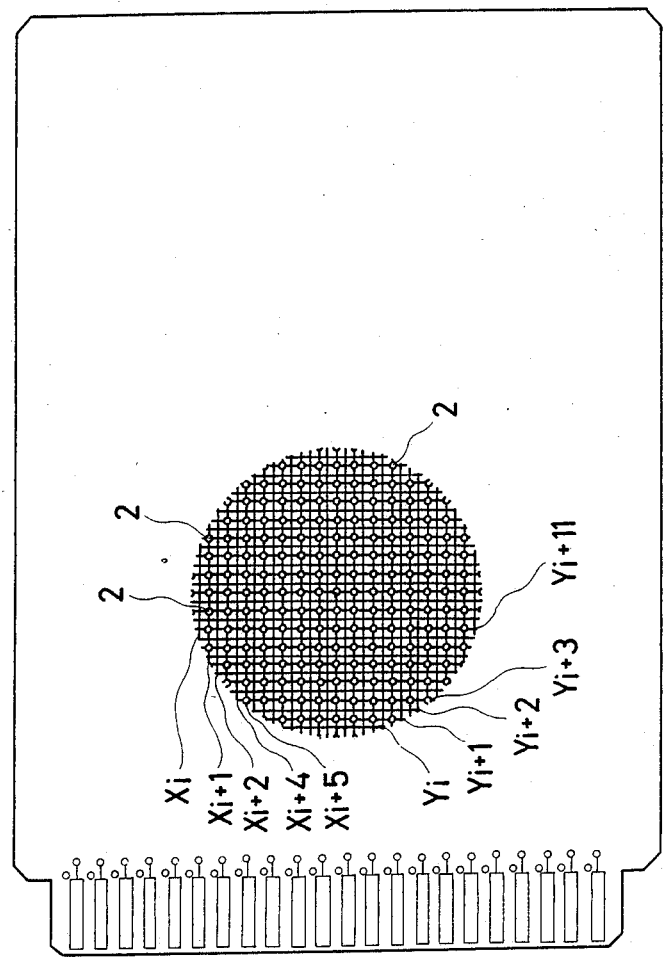

PRINTED CIRCUIT BOARD CONSTRUCTION AND METHOD FOR PRODUCING PRINTED CIRCUIT END PRODUCTS

BACKGROUND AND SUMMARY OF THE INVENTION

This invention relates to the construction of printed circuit (P.C.) boards and has as its goal providing convenience for people who undertake printed circuit testing by making a small quantity of of a printed circuit, and also offers a new processing method therefor. The main points emphasized by this invention are detailed separately as follows:

First, a P.C. board construction is provided. A double-sided P.C. board having both sides thereof prebonded with conductive metal plating thereon has, by the usual chemical erosion (i.e. etching) method, its first side formed with a crossed mesh form or any mesh form using two groups of parallel conductor lines, in such a way that one group of parallel lines comprises lines $X_1$, $X_2$, $X_3$, ... $X_{2n+1}$, while the other group of parallel lines comprises lines $Y_1$, $Y_2$ ... $Y_m$. The second side of the P.C. board is also made in a mesh form by using two other groups of parallel conductor lines, in such a way that one group of parallel conductor lines comprises lines $X'_1$, $X'_2$, $X'_3$ ... $X'_{2n+1}$, while the other group comprises lines $Y'_1$, $Y'_2$ ... $Y'_m$. Furthermore, line $X_1$ corresponds with line $X'_1$, line $X_3$ corresponds with line $X'_3$ ... $X_{2n-1}$ and $X'_{2n-1}$ correspond, $Y_1$ corresponds with $Y'_1$, $Y_2$ corresponds with $Y'_2$ ... $Y_m$ and $Y'_m$ correspond so as to be lined up one after another. The respective crossing points of $X_1$ with $Y_1$, $Y_2$ ... $Y_m$, $X_3$ with $Y_1$, $Y_2$ ... $Y_m$, etc., are punched or preset pass-thrrough holes 2. Finally, one layer of metal is plated on the inside edges of the pass-through holes 2, so that the the parallel lines of both board sides can be mutually connected via a plated-through hole passage.

When producing printed circuit end products, first, the layout of a printed circuit is made. Then a blade (or other cutting device) is used to cut off the unnecessary parts of all the lines on the P.C. board having the above-mentioned structure, so that after cutting it results that their connection paths are exactly the same as the circuit layout. Finally, the necessary electronic components and parts are inserted into the pass-through holes of a pre-layout (the necessary selection of insertion or application holes is arranged in advance prior to cutting of the lines) and soldered to finish the end product printed circuit.

Using this method requires no boring of holes in the board or erosion/etching and is thus time-saving as these are complicated jobs. Therefore, the P.C. board construction wil be very simple and convenient.

For the above-described construction, one can also use a computerized cutting system and enter in advance the location data of the metallic lines to be cut-off into this system, in such a way that the parts unnecessary for connection can be cut off automatically without requiring the inconvenient layout work.

BRIEF DESCRIPTION OF THE DRAWINGS

FIG. 1 shows a P.C. board constructed in accordance with invention, showing one side thereof;

DETAILED DESCRIPTION OF THE INVENTION

Nowadays, as the electronic industry is developing, factories and traders are continuously developing new products daily, and in such development, testing and improvement play a very important role. Therefore, a trial (i.e. prototype) P.C. board becomes an indispensable testing tool of the electronic industry.

Further, the trial or prototype P.C. board is also very important to students in the firld of electronics or in related fields, because it is essential to the students in the testing of printed circuits.

At present, there are three methods of prototyping and testing P.C. boards: using so-called "bread boards", soldering so-called "versatile boards" and wiring "versatile boards". These methods are well known, and their advantages and disadvantages will be described as follows:

The "bread board" has the advantages of high repeatability, low cost, and ease of error correction. Disadvantages include unsuitability for large volume, and ianbility to test on machines or in products. It requires manpower to connect the wiring and thus it wastes time and manpower. There is only one original board, and thus for reproduction it needs to be wired again.

Soldering "versatile board" has the advantages of suitability for small volume, and low costs. It has the disadvantages that it requires manpower to solder and thus it wastes time and manpower. It is difficult to correct errors. It incurs short circuits easily. There is only one original board, so that for reproduction it needs to be wired again.

Wiring "versatile board" has the advantage that no soldering is required. It has the disadvantages that it is high in cost, and is not suitable for large volume production. It needs to be wired manually. There is only one original board, so that for reproduction it needs to be wired again.

In view of the above, the present invention has been made after hard study and research. The main characteristic of this invention is that the inside edges of all of the holes for plugging-in electronic parts and components on the P.C. board should be plated with a metal layer, and all such holes should be connected together into a conductive path in the the printed circuit method, and during the process one can use a blade to cut off some metal conductors on the printed circuit and let only certain holes be rendered independent (i.e. not be connected with any other hole) or only be connected with some certain specified holes. In such a way, one can cut off the conductors properly in accordance with the layout of the circuit and obtain the required P.C. board.

By means of a practical example, the invention is further explained as follows.

FIG. 1 shows a P.C. board according to this invention. By way of explanation, for preparing a crossed mesh of parallel metallic lines or traces, to show the details we will follows a real case.

Figure 5:
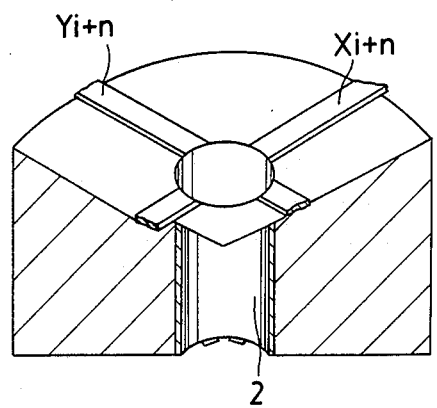
FIG. 5 is a perspective view in partial section showing the detail of a pass-through hole.

FIG. 1 shows parallel metal lines on the first side of a P.C. board and the distribution status of pass-through holes 2. $X_i$, $X_{i+1}$ ... etc., are the first group of parallel metal conductor traces, $Y_i$, $Y_{i+1}$ ... etc., are the second group of parallel metal conductor traces. Elements 2 are the pass-through holes between the parallel metal conductor traces, and on every separate crossing point of the parallel metal conductor traces and on the inside edge of such pass-through holes a metal layer has been plated, as shown in FIG. 5.

Figure 2:
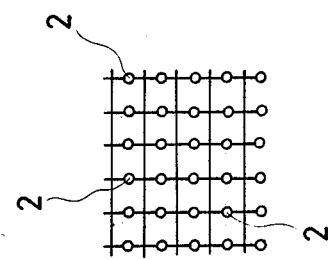
FIG. 2 shows a detail view of the distribution of conductor lines traces and pass-through holes on the other side of the P.C. board of FIG. 1.

FIG. 2 shows the distribution status of the parallel metal conductor trace lines (the runic boldface lines shown are parallel metal lines) and pass-through holes on the second side of the P.C. board.

From the above-mentioned two figures we can appreciate that the metal plated on the inside edge of all the pass-through holes will be connected with the parallel metal conductor traces on both sides of the P.C. board into a conductive path. If one wants to make a certain pass-through hole independent and not connected with any other pass-through holes, then one only needs to separate, with a blade or other means, the metal lines around the pass-through hole on both sides of the P.C. board (i.e. the first and second sides of the P.C. board).

Figure 3:
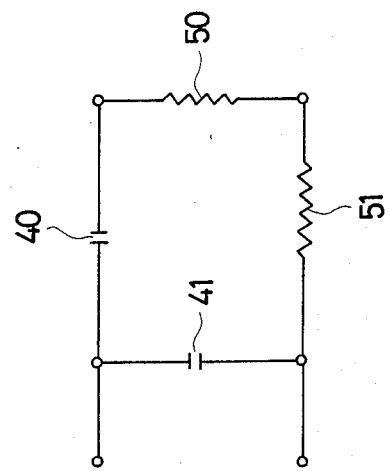
FIG. 3 is a circuit diagram of an exemplary circuit to be implemented on the P.C. board of the invention.
Figure 4:
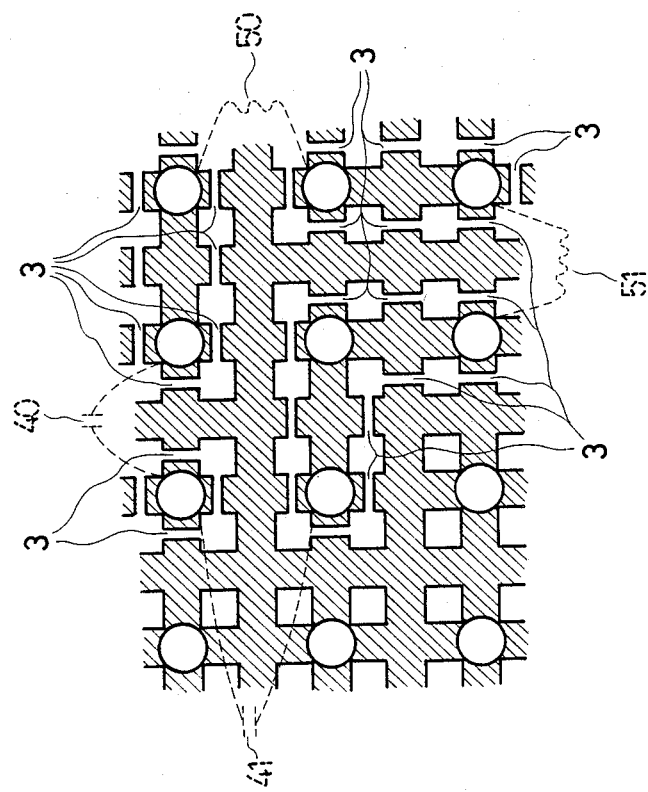
FIG. 4 is a detail view showing implementation of the circuit of FIG. 3 on the P.C. board of the invention.

FIG. 3 shows a simple example of a circuit wiring diagram, comprising capacitors 40, 41 and resistances 50, 51. FIG. 4 is a practical example according to this invention for connection of the electronic circuit of FIG. 3, and the item 3 shown in this figure is the location points of the metal conductors which have been separated on the first side of the P.C. board (the runic boldface lines shown are parallel metal lines), and all the opposite points of the respective separated points on the second side of the P.C. board also have been separated in the same way (not shown). Therefore, as shown in the figures, the circuit connection method on the board in FIG. 4 is not different from that shown in FIG. 3.

In fact, one can use the periphery, on both the upper and bottom sides of the P.C. board, of the pass-through holes as the cutting location for making the pass-through holes independent and give such as a coordinate index. When connecting one electronic circuit, first of all one selects out the pass-through holes to be used for plugging-in electronic parts and/or components. Then, according to the connection status of the electronic circuit, one selects out the cutting location(s). And finally, one inputs such index data of the cutting points into a separate computerized cutting system which comprises one blade which can be controlled for vertical or horizontal operation, and the vertical or horizontal control of such blade will be subject to the input location index. When the system is in operation, one puts the P.C. board at the specified position of the system, and after pressing down the start switch, the cutting blade of the system will cut off the required cuting-off points on the electronic circuit automatically.

The above-mentioned computerized cutting system is mainly implemented by means of an X-axis motor and a Y-axis motor, which act to control, respectively, the movement in the X and y axes of a cutting blade. The X-axis motor and the Y-axis motor are variable speed motors, and the repeated number of revolutions thereof are controlled by the preset input data. For every possible cutting-off location on the printed circuit board, one enters in advance respectively in the form of a right angle (i.e. orthogonal) coordinate data of X and Y corrdinates and sets one staring position (i.e. the original coordinate point). In such a way, in accordance with the circuit layout, one can decide which location should be cut off and let such cut-off position data (including both the X and Y axis data) be input into the "cutting memory" of the system. The cutting blade will, each time after read-out of position A in the "cutting memory" and having completed one cutting operation, then continue according to read-out of the data of position $A+1$ in the "cutting memory" and complete the second cutting operation, . . . etc., in such a way, until all of the stored data in the "cutting memory" have been read-out.

In addition to the above-mentioned X-axis and Y-axis motors, the system further consists of one "lifting mechanism" and "vibrating mechanism" for the purpose of respectively controlling the lifting of the cutting blade (namely to control the cutting blade to contact the P.C. board or separate from the P.C. board) and its cutting to the cutting point. The "lifting mechanism" can be either a motor or an electromagnet for the purpose of lifting the cutting blade (to separate from the P.C. board) or dropping the blade (to contact the P.C. board) during the cutting process. The "vibrating mechanism" is provided for the purpose that, when the cutting blade has been dropped down and kept in contact with the P.C. board, it can let the cutting blade be vibrated again to cut off the metal conductor traces.

There has been described above a computerized cutting system which can produce a series of cutting movements and which, in coordination with the control of a microcomputer, may easily complete the entire cutting process. However, the main object of this invention is to offer an improved P.C. board and by means of such board to complete the the production method of a P.C. product, and the invention does not refer to the computerized cutting system. Therefore, detailed description of the mechanisms and of the circuit software as well as the coordinating software structure will be omitted here.

As mentioned above, one can easily appreciate the features of this invention which are summarized as follows:

The layout of the P.C. board is arranged in a mesh form and at every second respective crossing point of the mesh there is a metal-plated pass-through hole between the respective board sides. In addition, each of the metal conductor traces is arranged on both the front and rear sides of the P.C. board, and therefore the layout density of the board unit area can be increased.

After cutting off the metal conductor traces on the P.C. board, there will still be some useless metal conductor traces left, and after earthing (i.e. grounding) of such useless metal conductor traces. the board can produce excellent noise suppression effect.

The P.C. board construction according to the invention can save much production time, and facilitates corrcetion and reproduction. It offers the advantages of low cost and is suitable for small quantity production in the laboratory. There is no troublesome soldering of many points, and it is easy to inspect and provides a clean, finished appearance.

Besides using a blade to cut off the metal conductor traces, one can also use other means, for example one can use a chemical method to make some metal conductors short circuit and to make one certain hole independent or only be connected with some other specified holes.

What is claimed:

1. A printed circuit board comprising a board having front and rear sides, each said side being provided thereon with a mesh-like conductor pattern consisting of two crossing sets of plural parallel metal conductor traces, the respective sets of conductor traces on the front and rear sides corresponding with one another, wherein a through hole passing through said board from the front to the rear side thereof is provided at every second crossing point of the conductor traces in each direction of the conductor traces on each side of the board, each said hole being plated on its inside edge, the plating of each hole being connected with the respective crossing conductor traces at its respective location on both the front and rear sides of the board, said holes conductively connecting the respective crossing conductors on the front and rear sides of the board to one another, said conductor traces selectively severable on each side of the board for isolating selected holes from their respective corssing conductor traces.

2. A method for producing a printed circuit board comprising:

providing a mesh-like pattern of conductors on front and rear sides of a board, the mesh-like pattern consisting of two crossing sets of plural parallel metal conductor traces, the respective sets of conductor traces on the front and rear sides of the board corresponding with one another;

providing a through hole passing through said board from the front to the rear side thereof at every second crossing point of the conductor traces in each direction of the conductor traces on each side of the board, plating each said hole from the front to rear side of the board, conductively connecting the plating of each said hole with the respective crossing conductor traces at its respective location on both the front and rear sides of the board, said holes conductively connecting the respective crossing conductor traces, on the front and rear sides of the board to one another, and severing selected ones of said conductor traces on each side of the board for isolating selected ones of said holes from their respective crossing conductor traces.

* * * * *